(12) United States Patent
Takatori et al.

(10) Patent No.: US 7,154,979 B2
(45) Date of Patent: Dec. 26, 2006

(54) TIMING RECOVERY WITH VARIABLE BANDWIDTH PHASE LOCKED LOOP AND NON-LINEAR CONTROL PATHS

(75) Inventors: Hiroshi Takatori, Sacramento, CA (US); James M Little, Sacramento, CA (US); Scott Chiu, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 670 days.

(21) Appl. No.: 10/003,330

(22) Filed: Mar. 11, 2002

(65) Prior Publication Data

US 2003/0169837 A1 Sep. 11, 2003

(51) Int. Cl.
*H03D 3/24* (2006.01)
(52) U.S. Cl. ............................................. 375/376
(58) Field of Classification Search ................. 375/371, 375/376, 354, 355, 360, 364; 327/147, 156, 327/231, 233, 236, 244; 331/17, 23, 1 A
See application file for complete search history.

(56) References Cited

U.S. PATENT DOCUMENTS

| | | | | |
|---|---|---|---|---|
| 5,247,544 A | * | 9/1993 | LaRosa et al. | 375/371 |
| 5,448,598 A | * | 9/1995 | Yousefi et al. | 375/376 |
| 5,574,757 A | * | 11/1996 | Ogawa | 375/376 |
| 6,031,428 A | * | 2/2000 | Hill | 331/17 |
| 6,614,316 B1 | * | 9/2003 | Masenas et al. | 331/17 |
| 6,630,868 B1 | * | 10/2003 | Perrott et al. | 331/17 |
| 6,735,259 B1 | * | 5/2004 | Roberts et al. | 375/316 |
| 2003/0053576 A1 | * | 3/2003 | Cao | 375/375 |

FOREIGN PATENT DOCUMENTS

JP 0067420 9/2000

OTHER PUBLICATIONS

"LXT360 T1/E1 LH/SH Transceiver," [online], [retrieved Jan. 17, 2002], retrieved from the Internet: <URL:http://www/intel.com/design/network/products/wan/tecarrier/lxt360.htm>.
"LXT360—Integrated T1/E1 LH/SH Transceiver for DS1/DSC-1 or PRI Applications," Order No. 249031-001, Jan. 2001, pp. 1-54.
"A New Symbol Synchronizer with Reduced Timing Jitter for QAM Systems", Zhang Hang and Markku Renfors, IEEE, 1995, pp. 1292-1296.
XP 000608506, IEEE Transactions on Communications, vol. COM-34, No. 5, May 1986, "A BPSK/QPSK Timing-Error Detector for Sampled Receivers" Floyd M. Gardner, pp. 423-429.

* cited by examiner

*Primary Examiner*—Khanh Tran
*Assistant Examiner*—Sam K. Ahn
(74) *Attorney, Agent, or Firm*—Pillsbury Winthrop Shaw Pittman LLP

(57) ABSTRACT

A timing recovery system includes a phase locked loop with a variable bandwidth loop filter, several data dependent gain units, and three proportional paths with non-linear control. The system provides excellent jitter tolerance with a wide variation in data density and large amplitude jitter with a wide frequency range. The gain of both an included loop filter and a phase detector may be varied with both frequency and data density. Direct, unfiltered adjustments may be made to phase based on a received data pattern and phase error magnitude to reduce loop latency and provide temporary and immediate boost in the loop gain of the phase locked loop. Direct, unfiltered adjustments may also be made to phase based on the sign of the first differential of an accumulator output during long strings of zeros to help maintain tracking even with a very low data density.

23 Claims, 7 Drawing Sheets

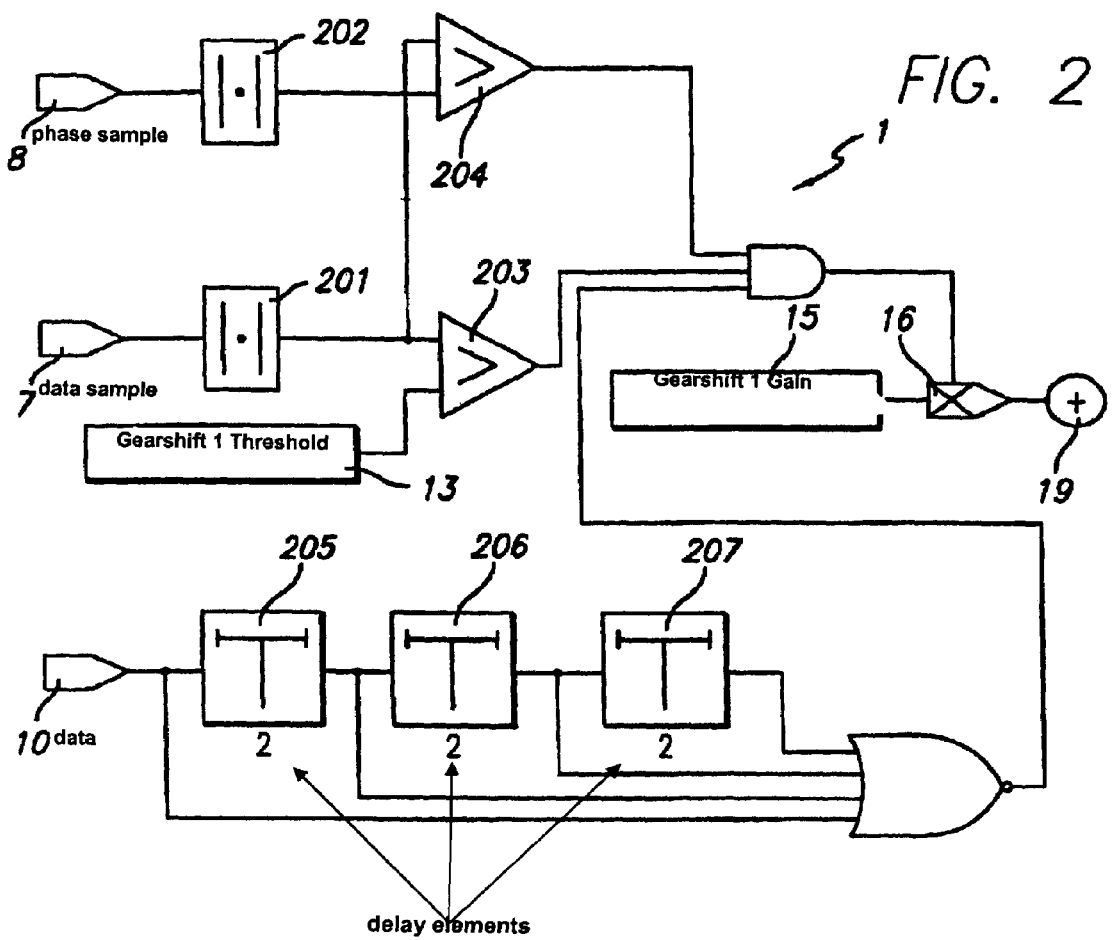

TIMING RECOVERY WITH VARIABLE BANDWIDTH PHASE LOCKED LOOP AND NON-LINEAR CONTROL PATHS

BACKGROUND OF THE INVENTION

1. Field of the Invention

The present invention generally relates to communications systems that handle a wide variation in data density, large amplitude jitter with a wide frequency range, and imperfect equalization, such as T1 networks. More particularly, the present invention relates to a timing recovery system including a linear phase-locked loop ("PLL") with a variable bandwidth loop filter and three proportional paths with non-linear control.

2. Discussion of the Related Art

Networking applications have become popular in recent years, in response to an explosion in the use and variety of networks employed in a vast array of computing settings. Correspondingly, many advances have been made in the related technology in order to improve the quality of these systems. For instance, fully integrated transceivers for T1 Channel Service Unit ("CSU") and Integrated Services Digital Network ("ISDN") Primary Rate Interface applications are known in the art, and are presently commercially available. These devices are useful for networking applications, such as timing recovery in T1 systems. However, there are obstacles that prevent such systems from providing good jitter tolerance, a desirable quality in communications networks, and other applications. Such obstacles can include exceptionally large amplitude jitter, a wide variation in data density, large amounts of cable attenuation, and imperfect equalization.

Jitter is the general term used to describe distortion caused by variation of a signal from its reference timing position in a transmission communications system. In an ideal system, bits arrive at time increments that are integer multiples of a bit repetition time. In a real system, however, pulses arrive at times that deviate from these integer multiples. This deviation may cause errors in the transmission of data, particularly when data is transmitted at high speeds. The deviation or variation may be in the amplitude, time, frequency or phase of this data. Jitter may be caused by a number of phenomena, including inter-symbol interference, frequency differences between the transmitter and receiver clock, noise, and the non-ideal behavior of the receiver and transmitter clock generation circuits.

Jitter is a problem of particular import in digital communications systems for several reasons. First, jitter causes the received signal to be sampled at a non-optimal sampling point. This occurrence reduces the signal-to-noise ratio at the receiver and thus limits the information rate. Second, in practical systems, each receiver must extract its received sampling clock from the incoming data signal. Jitter makes this task significantly more difficult. Third, in long distance transmission systems, where multiple repeaters reside in the link, jitter accumulates.

Jitter amplitude is typically measured in unit intervals ("UI") where 1 UI equals 1 period of bit repetition time. For example, in T1 networks, 1 UI is equal to 648 microseconds and in E1 networks, 1 UI is equal to 488 microseconds. Normal ranges of jitter vary widely depending upon the specific application. For T1 systems, the incoming jitter is generally limited to approximately 5 UI peak-to-peak for jitter frequencies between 10 Hz and 40 KHz, and 0.1 UI peak-to-peak for jitter frequencies between 8 KHz and 40 KHz. However, T1 receivers generally must be able to tolerate sinusoidal jitter with an amplitude as high as 0.4 UI between 10 KHz and 100 KHz, and as large as 28 UI at 300 Hz for network interoperability.

Accordingly, there is a need for a timing recovery system capable of providing improved jitter tolerance, especially for systems that must manage wide variations in data density and large amplitude jitter in large frequency ranges.

BRIEF DESCRIPTION OF THE DRAWINGS

FIG. 2 illustrates a block diagram of a first non-linear proportional path in accordance with an embodiment of the instant invention;

DETAILED DESCRIPTION

Figure 1A:
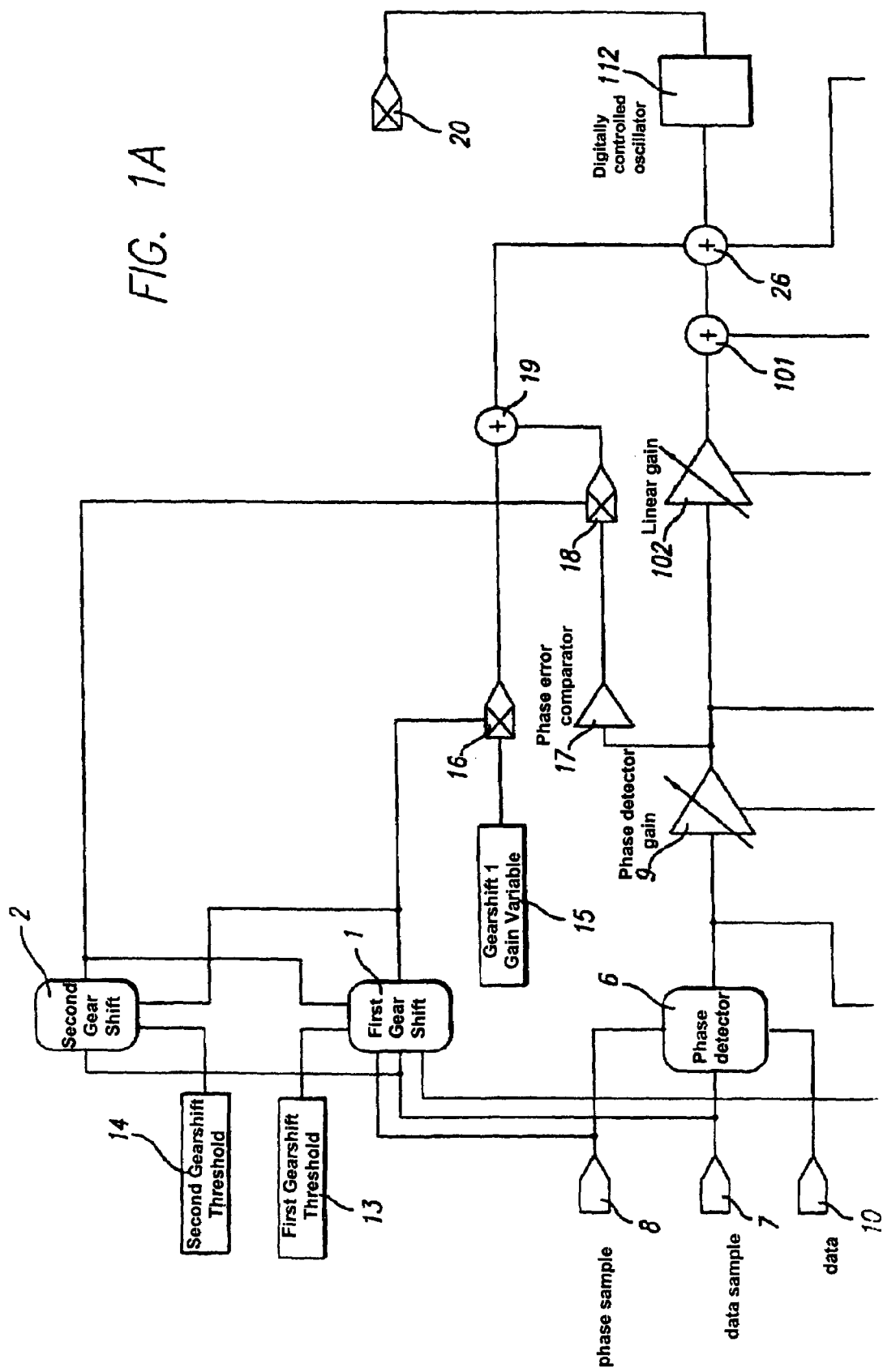
FIGS. 1a and 1b illustrate a block diagram of a digital phase locked loop with three non-linear proportional paths in accordance with an embodiment of the instant invention.

In one embodiment of the present invention, a timing recovery system is provided. The system includes a PLL with a variable bandwidth loop filter, several data dependent gain units and three proportional paths with non-linear control. The system provides improved jitter tolerance even with a wide variation in data density and large amplitude jitter over a wide frequency range. The gains of both an included loop filter and phase detector may be varied with both frequency and data density. Direct, unfiltered adjustments may be made to phase based on a received data pattern and phase error magnitude to reduce loop latency and provide a temporary and immediate boost in the loop gain of the PLL. Direct, unfiltered adjustments may also be made to phase based on the sign of the first differential of the accumulator output during long strings of zeros to help maintain tracking, even with a very low data density.

In another embodiment of the present invention, a method of providing enhanced jitter tolerance in a communications network is provided. A communications network with three non-linear paths and a PLL is provided. Data is input to the communications network. A phase error is estimated based on a data sample from both the center of the data eye of the input data and from a phase sample from the input data half-a-baud later in time. The phase error is then correlated with the sign of the recovered data. The correlated phase error is then multiplied by a gain. The multiplied and correlated phase error is filtered by a loop filter to generate an output. This output is summed with output from the non-linear paths to generate a summed output. Finally, the summed output is converted into clock phase information.

The system preferably implements a PLL, which may be of any suitable order. For instance, a second order PLL may be suitable for use in accordance with the various embodiments of the present invention. A PLL is a feedback control system designed to lock the phase of a local clock to the phase of an incoming signal. A PLL generally includes a phase detector whose output is proportional to the difference between the incoming phase and the output phase of an included voltage controlled oscillator ("VCO") or a digitally controlled oscillator ("DCO"); a loop filter whose output is proportional to the input but with some desired frequency characteristic; and a VCO or DCO whose output phase is proportional to the integrated input voltage.

The components of a PLL may be implemented as either an analog or digital circuit. In operation, the phase detector computes the error (i.e., the difference between the incoming and local phase), which is then filtered by the loop filter and presented to the VCO, which changes its own output phase accordingly. Owing to overall negative feedback, the PLL tends to drive the error signal to zero, thus forcing the output phase of the VCO to be equal to the input phase.

The order of a PLL depends upon the number of integration operations included therein. The VCO or DCO provides one integration. Thus, a PLL with no integrators in the loop filter has an order of one. A second order PLL, which may be included in the embodiments of the present invention, includes one integrator in the loop filter.

A PLL can provide good jitter tolerance for many applications. However, some applications, such as timing recovery in T1 systems, require good jitter tolerance in the presence of exceptionally large amplitude jitter, which may range in frequency from 300 Hz to 100 KHz. Further, these systems must be capable of handling wide variations in data density, large amounts of cable attenuation, and imperfect equalization. This combination of impairments makes the design of the timing recovery PLL quite difficult. An additional impairment is found in systems based upon digital signal processor techniques where the latency between the sampling clock and the output of the timing recovery may be large.

For systems with such impairments, the performance of the timing recovery may be enhanced by adding several non-linear proportional paths, also referred to as gearshifts, to the PLL. The preferred timing recovery system 100 depicted in FIG. 1 contains three such paths, 1, 2 and 3. The system includes a data density detector 4, which monitors the received data density and adjusts the linear gain 102 and phase detector gain 9 to maintain a constant gain and bandwidth with variations in data density. The system also includes a frequency detector 5, which detects the frequency of an incoming timing jitter and adjusts the bandwidth of the PLL to maximize the jitter tolerance over a wide range of frequencies.

Figure 3:
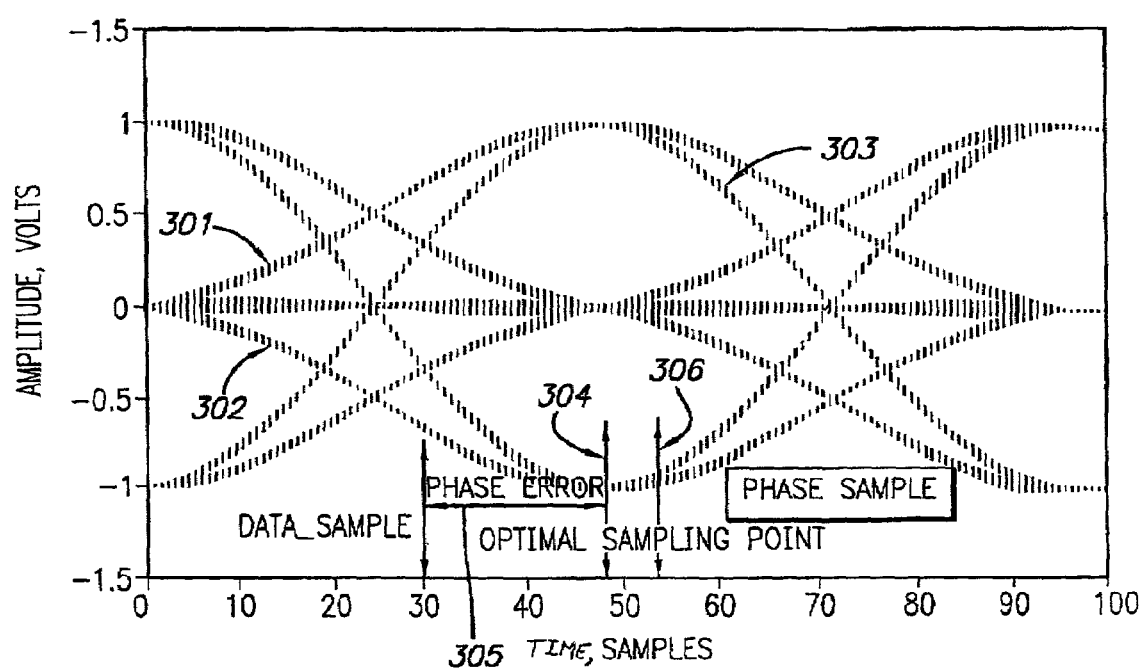
FIG. 3 illustrates an eye diagram, depicting an operation of the non-linear proportional path of FIG. 2.

The operation may be seen by reference to FIG. 3, which is an eye diagram. An eye diagram will be recognized by one skilled in the art as a method used to assess the signal-to-noise ratio of a random signal in a communications system. It is created by sampling the desired signal with a fixed clock (typically synchronized with the transmit clock) while transmitting random data and overlaying all of the received traces on top of one other. One can, by inspection, estimate the likelihood of making an error in the bit decision.

For example, as depicted in FIG. 3, when the timing recovery system of the present invention is operating correctly, the sampling point 304 is exactly in the center of the eye, and the distance between the decision threshold (+/−0.5 V) and the signal is maximized. The first and second transitions 301 and 302, respectively, that might trigger the first gearshift 1 are indicated along with the data sample with a positive phase error 305, and the phase sample 306. Assuming that the equalization of the receiver is designed to provide a reasonable pulse shape (i.e., one that is similar to a raised cosine pulse and thus possessing a minimum amplitude at integer multiples of the bit rate), then by judiciously selecting the threshold against which the data sample is compared, the amount of phase error necessary to trigger the gearshift may be selected. Preferably, the threshold for the first gearshift 1 in this system is approximately 0.27 V. The amount of phase adjustment provided by each correction is set by the gearshift 1 gain value.

Figure 1B:
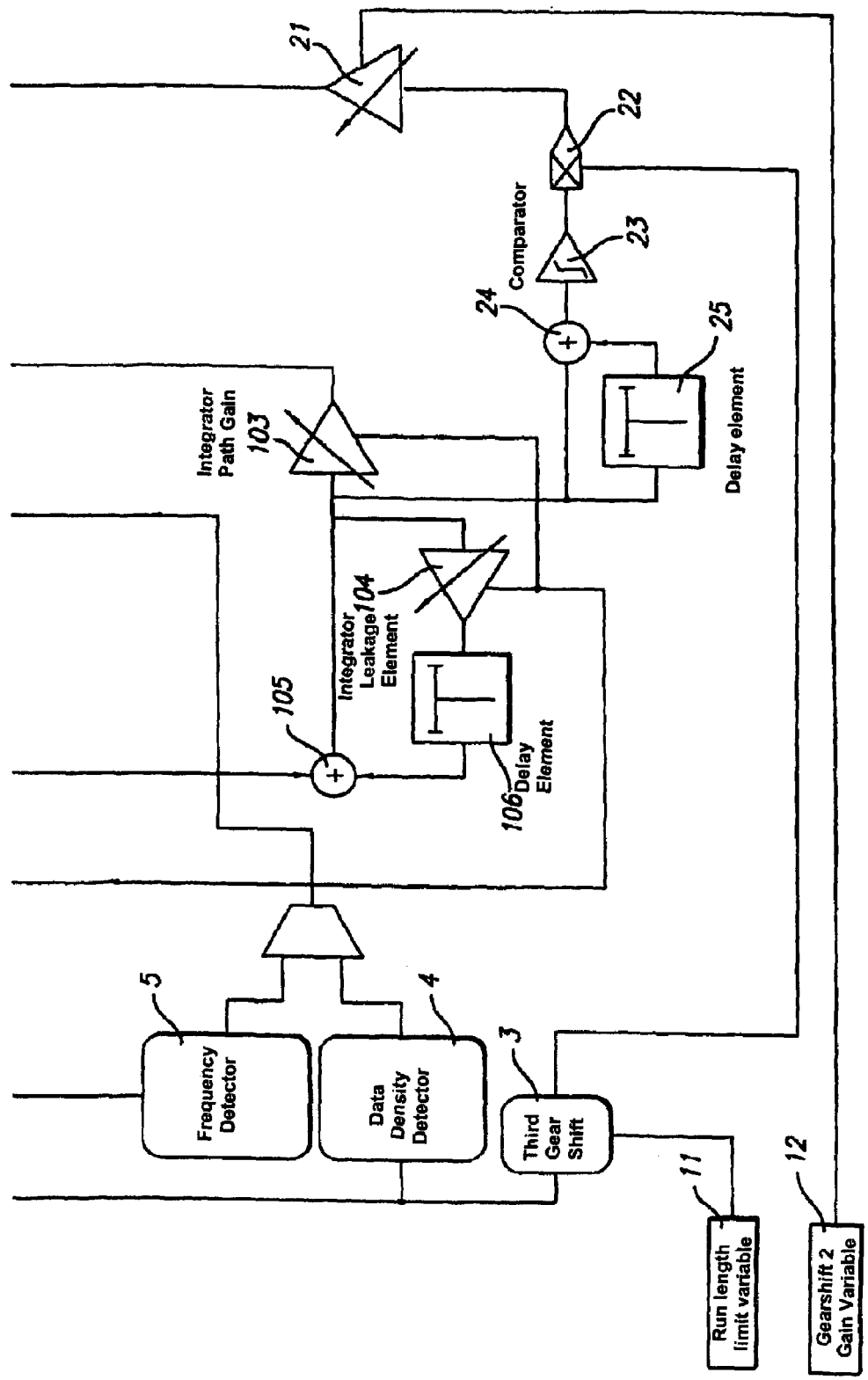

FIGS. 1a and 1b illustrate a block diagram of a preferred timing recovery system 100. The core of this system is a digital PLL which may include a phase detector 6, a proportional-plus-integral loop filter (101, 102, 103, 104, 105, 106), and a digitally controlled oscillator 112. The loop filter illustratively includes an accumulator (104, 105, 106) along with a linear gain 102, an integrator path gain 103, and a first summing node 101. The accumulator may further include an integrator summing node 105, a delay element 106, and an integrator leakage element 104. Herein, the digitally controlled oscillator 112 may be a digital to analog converter ("DAC") 112.

The preferred timing recovery system 100 may further include gear shift 1 and 3 gain variables 15 and 12, respectively; gear shift 1, 2, and 3 multipliers 16, 18, and 22, respectively; gear shift 1 and 2 thresholds 13 and 14, respectively; gear shift 3 gain element 21 and comparator 23. Preferably, the system 100 also includes a phase error comparator 17, a summing node 19, a clock output 20, a differentiator summing node 24, a delay element 25, and a summing node 26.

In operation, the phase detector 6 preferably estimates the phase error based on two samples of the incoming signal: the data sample 7 from the center of the data eye and the phase sample 8, half-a-baud later in time. The phase error may be correlated with the sign of the recovered data, multiplied by a gain 9, and filtered by the loop filter at a first summing node 101. The output of the linear filter may be summed with any outputs from the non-linear paths 1, 2 and 3 at summing node 26 and converted into clock phase information by the DAC 112. The gain and bandwidth of the linear PLL is preferably varied according to the received data density and the incoming jitter frequency. Each of the three non-linear paths 1, 2 and 3 is preferably triggered by a different set of input conditions and is designed to boost the effective proportional path gain in that situation. The first gearshift 1 is preferably based on the received data pattern; the second gearshift 2 is preferably based on the amplitude of the data samples; and the third gearshift 3 is preferably based on run-length or number of sequential zeros.

FIG. 2 shows a block diagram of a first gearshift 1, which is a pattern-based operation. The circuit may receive phase sample 8, data sample 7, and data 10, and look for strings of zeros followed by a plus or minus one. Preferably, absolute value functions 201 and 202, and logical greater than functions 203 and 204 are included to assist in the location of this information. Most preferably, logical greater than function 203 returns an output of true where the absolute value of data sample 7 is greater than gear shift 1 threshold 13. Similarly, logical greater than function 204 preferably returns an output of true where the absolute value of data sample 7 is greater than phase sample 8. This data may then be multiplied through gear shift 1 multiplier 16 by a gear shift 1 gain 15 and output to summing block 19. The first gearshift 1 illustratively depicted in FIG. 2 looks for strings of four zeros, owing to three delay elements (205, 206, and 207) being included therein. In alternate embodiments the first gearshift 1 may be designed to search for any appropriate number of zeros, by altering the number of delay elements.

Figure 4:
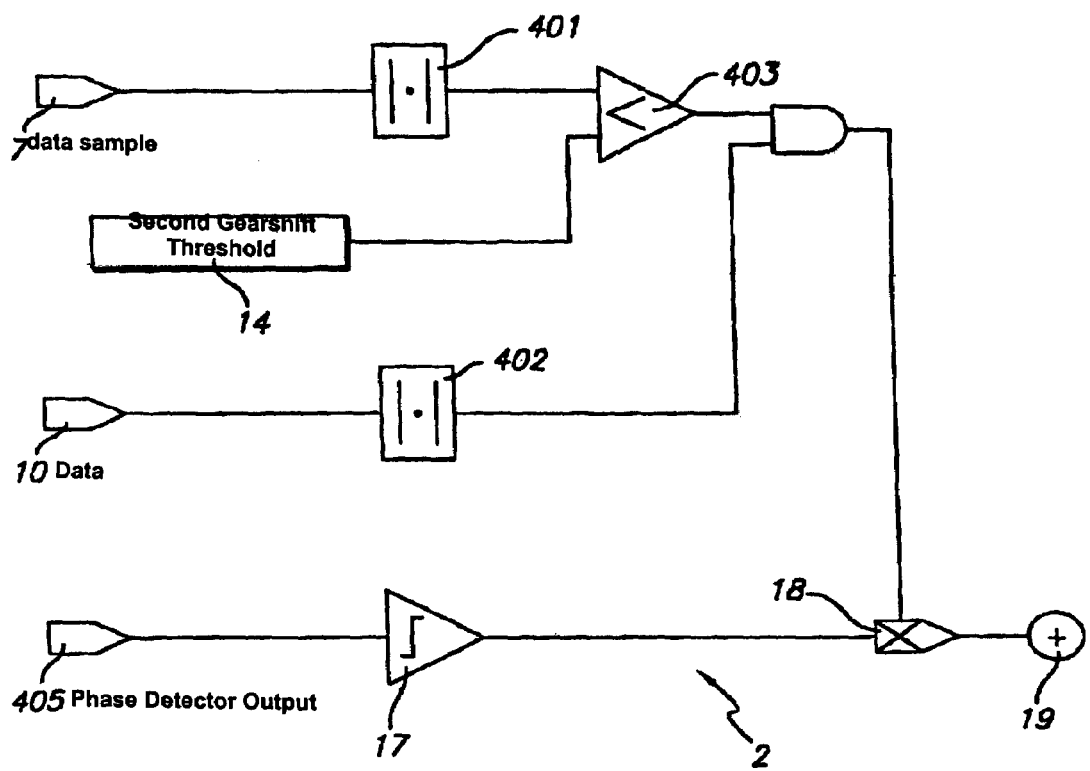
FIG. 4 illustrates a block diagram of a second non-linear proportional path in accordance with an embodiment of the instant invention.

The second gearshift 2, shown in FIG. 4, is preferably triggered when the amplitude of the data sample 7 falls below a specified second gearshift threshold 14, most preferably set at about 0.7 V, and the decision is a plus or minus one such as that indicated at sample point 303 in FIG. 3. This scenario may be presented when the data density is low (i.e., there is not much phase information) and the jitter amplitude is large. In such a situation, the PLL may not have enough phase information to properly track the incoming jitter, thus phase error can accumulate such that the data samples begin to approach the decision level. An immediate large step may therefore be made in the direction of the phase error. Although not depicted in FIG. 4, the size of the phase step may readily be varied by adding gain after the multiplier 18.

The second gearshift 2 illustratively depicted in FIG. 4 may receive data sample 7, data 10, and phase detector output 405. Preferably, absolute value functions 401 and 402, and logical less than function 403 are included. Most preferably, logical less than function 403 returns an output of true where the absolute value of data sample 7 is less than gear shift 2 threshold 14. Most preferably, the phase detector output 405 is manipulated through phase error comparator 17 and multiplied by multiplier 18 by the absolute value of data 10 ANDed with the logical less than function 403 output through gear shift 2, and output to summing block 19.

The operation of a third non-linear path 3 may be seen in FIGS. 1a and 1b. This third non-linear path, or gearshift 3, is illustratively a counter that increments when the received data 10 is a zero and is reset when the data 10 is one. When the counter reaches the value set in the run length limit variable 11, set at about 10 in a preferred embodiment, the output is preferably set high and an immediate step is made in the direction of the sign of the first differential of the accumulator output. This operation may help to reduce the accumulated phase error when there are long strings of zeros and the data density is low. In such a situation, there may be insufficient ones to provide enough phase error information to the loop filter, making it necessary to estimate the direction of the accumulated phase error. However, because of the relatively low bandwidth of the loop filter, the phase of the accumulator can lag the actual phase error by as much as 45 degrees. Thus, it is not necessarily the best estimate of the direction of the phase error. The first differential of the accumulator indicates the direction in which the phase error is changing and may be a better estimate for this condition.

Hold off counters (not shown) may further be included in the non-linear paths of the present invention. These counters prevent multiple triggers and the corresponding potential for over-adjustment. For example, if the third gearshift 3 has just triggered, it is possible that the next input one could cause either the first gearshift 1 or second gearshift 2 to trigger as well, resulting in over-correction. The hold off counters prevent a single gearshift from triggering on sequential bits and prevent any gearshift from triggering within some number of bits of another.

In addition to the non-linear control paths, two other control elements are preferably included in the timing recovery system of the present invention. As shown in FIGS. 1a and 1b, a data density detector 4 tracks the received ones density and adjusts the phase detector gain 9 and the linear gain 102 in order to minimize changes in the system response caused by variations in data density.

The frequency detector 5 may provide an estimate of the frequency of incoming jitter and may also be used to adjust PLL gains. The frequency detector 5 may further be utilized to adjust the accumulator leakage and gain to provide for greater rejection of high frequency jitter without sacrificing loop gain at lower frequencies.

Figure 5:
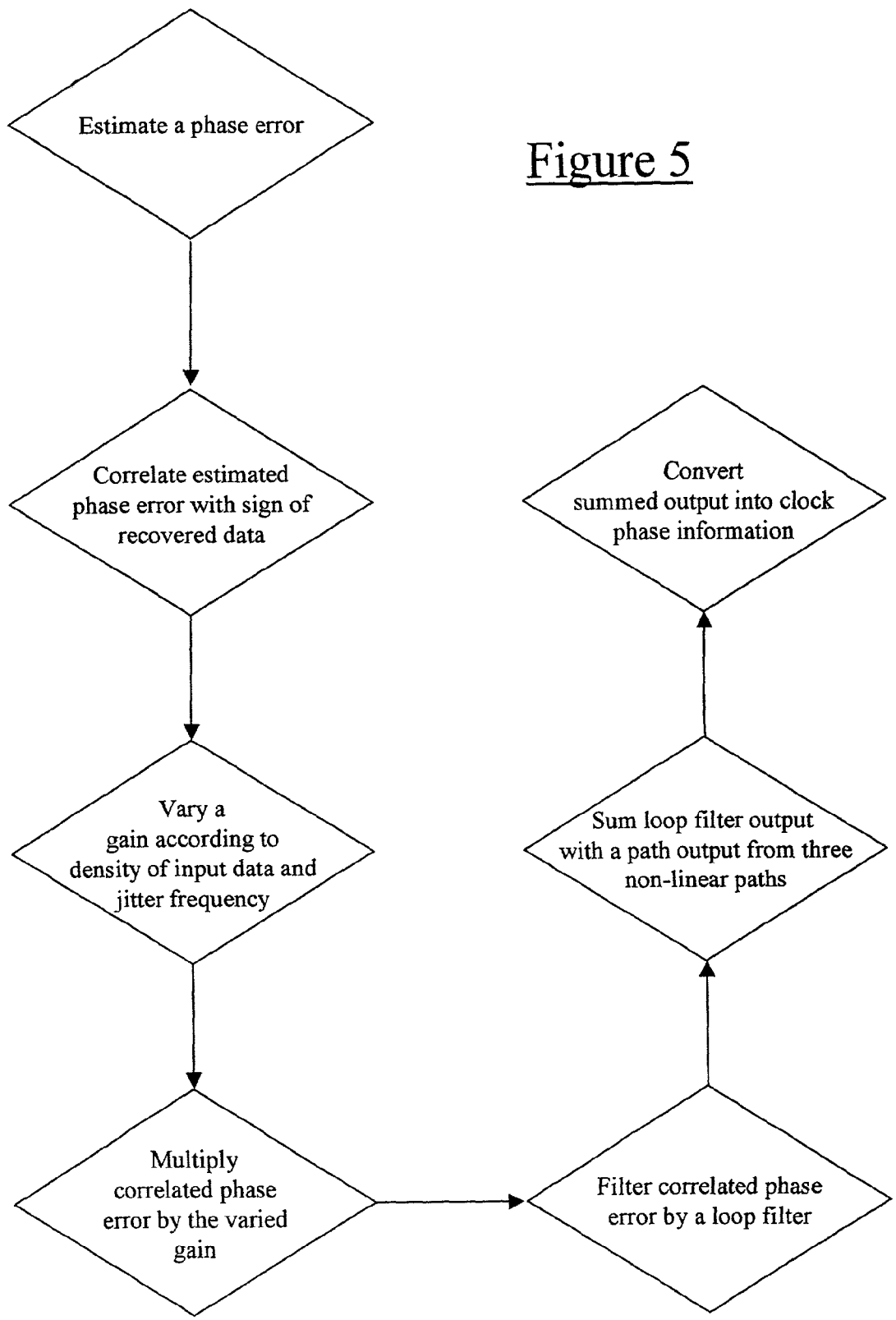
FIG. 5 illustrates a flow chart of a machine-readable program code in accordance with an embodiment of the instant invention.

The aforementioned embodiments of the instant invention may be embodied in a machine-readable program code, which may be further stored on a machine-readable storage medium. A most preferred embodiment of this code is illustratively depicted in flow chart form in FIG. 5. This most preferred code first includes the step of estimating a phase error based on a data sample from both a center of a data eye of input data and from a phase sample from the input data half-a-baud later in time. The phase error may be correlated with a sign of recovered data. The correlated phase error may be multiplied by a gain. The correlated and multiplied phase error may be filtered by a loop filter to generate an output. The output may be summed with a path output from at least one non-linear path. Most preferably there are three such non-linear paths. Finally, the summed output may be converted into clock phase information.

Figure 6:
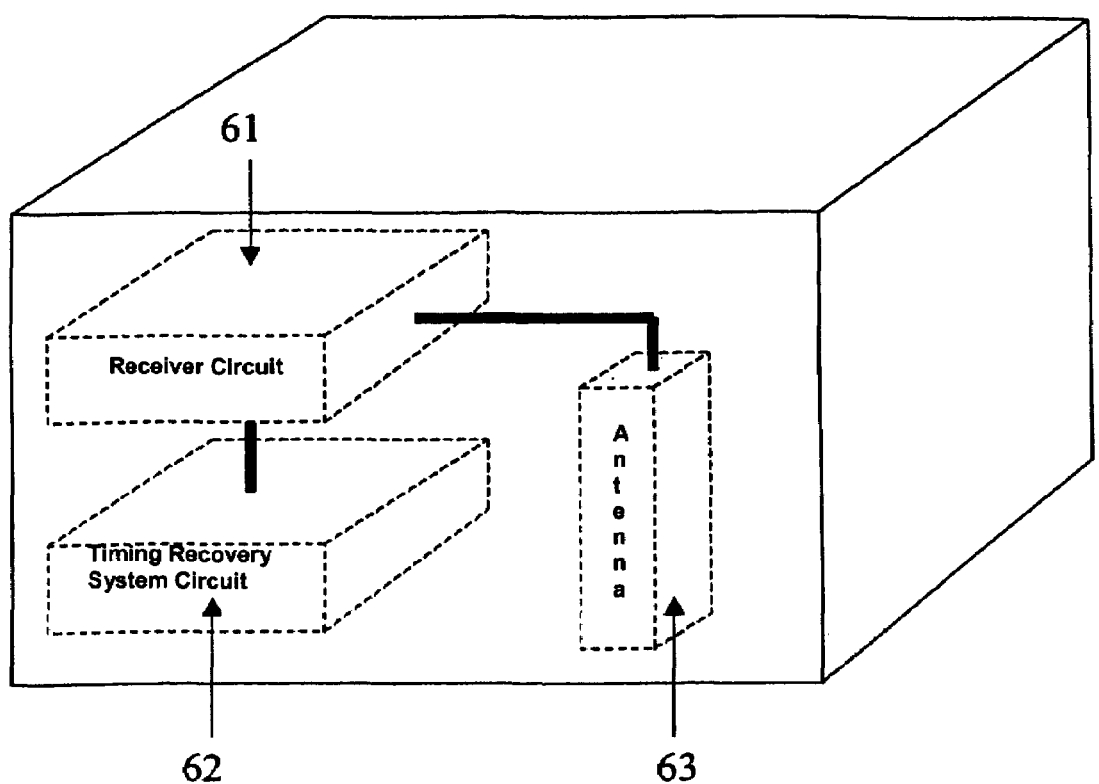
FIG. 6 illustrates a receiver circuit in accordance with an embodiment of the instant invention.

As illustratively depicted in FIG. 6, the aforementioned embodiments of the instant invention may be embodied in a receiver system. Preferably, the receiver system includes a receiver circuit 61 in electronic communication with an antenna 63. Most preferably, a timing recovery system circuit 62 is also in electronic communication with the receiver circuit 61. The timing recovery system circuit 62 is preferably in accordance with at least one of the embodiments described above. In preferred embodiments, the antenna 63 may receive an electronic signal and transmit this signal to the receiver circuit 61. The receiver circuit may then further transmit an electronic signal to the timing recovery system circuit 62.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes that come within the meaning and range of equivalency of the claims are therefore intended to be embraced therein.

What is claimed is:

1. A method of enhancing jitter tolerance in a communications network, comprising:

providing at least two non-linear paths, a first of said non-linear paths to adjust a phase of an input data in response to a data pattern of said input data, and a second of said non-linear paths to adjust said phase of said input data in response to an amplitude of data samples from said input data, and a phase locked loop to lock a phase of a clock to said phase of said input data;

inputting said input data to said communications network;

estimating a phase error based on said data samples from both a center of a data eye of said input data and from a phase sample from said input data half-a-baud later in time, said data samples and said phase sample being derived from said input data;

correlating said phase error with a sign of recovered data to provide a correlated phase error, the sign being a positive or negative value;

filtering said correlated phase error by a loop filter to generate an output;

summing said output with output from said at least two non-linear paths to generate a summed output; and converting said summed output into clock phase information.

2. The method of claim 1, further including varying a gain and bandwidth of said phase locked loop according to density of said input data and an incoming jitter frequency.

3. The method of claim 1, further including multiplying said correlated phase error by a gain prior to filtering said correlated phase error by said loop filter.

4. The method of claim 1, wherein providing at least two non-linear paths further includes providing three non-linear paths, a third of said three non-linear paths to reduce an accumulated phase error.

5. A timing recovery system to receive input data having a phase, comprising:
   a phase locked loop to lock a phase of a clock to the phase of said input data, said phase locked loop receiving said input data and generating a phase locked loop output, wherein said phase locked loop includes:
      a phase detector to determine said phase of said input data, said phase detector receiving said input data and generating a phase detector output; and
      a loop filter to provide an additional frequency characteristic to said phase detector output, said loop filter receiving said phase detector output and generating said phase locked loop output;
   a first proportional path with non-linear control to adjust the phase of said input data in response to a data pattern of said input data, said first proportional path receiving said input data and generating a first proportional path output;
   a second proportional path with non-linear control to adjust the phase of said input data in response to an amplitude of data samples derived from said input data, said second proportional path receiving said input data and generating a second proportional path output;
   a system summing node, wherein said phase locked loop output, said first proportional path output, and said second proportional path output are summed by said system summing node to generate a system summing node output;
   a data density detector to monitor a density of said input data, said data density detector receiving said input data and generating a data density detector output; and
   a frequency detector to determine a frequency of an incoming timing jitter of said input data, said frequency detector receiving said phase detector output and generating a frequency detector output.

6. The timing recovery system of claim 5, wherein said data pattern of said input data that causes said first proportional path to adjust said phase of said input data is a string of zeros followed by a value of one in said input data.

7. The timing recovery system of claim 5, wherein said loop filter includes:
   an accumulator to indicate a direction in which a phase error is changing, said accumulator receiving said phase detector output and generating an accumulator output; and
   a loop filter summing node, wherein said phase detector output and said accumulator output are summed by said loop filter summing node, generating said phase locked loop output.

8. The timing recovery system of claim 5, wherein said timing recovery system further includes:
   a third proportional path with non-linear control to reduce an accumulated phase error, said third proportional path receiving said input data and generating a third proportional path output, wherein said third proportional path output is summed by said system summing node.

9. The timing recovery system of claim 5, wherein said timing recovery system further includes an oscillator, said oscillator receiving said system summing node output and generating a final system output.

10. The timing recovery system of claim 9, wherein said oscillator is a digitally controlled oscillator (DCO).

11. The timing recovery system of claim 9, wherein said oscillator is a voltage controlled oscillator (VCO).

12. The timing recovery system of claim 9, wherein said oscillator is a digital-to-analog converter (DAC).

13. The timing recovery system of claim 5, wherein said loop filter further includes:
   a phase detector gain element, said phase detector gain element receiving said phase detector output prior to said phase detector output being input to said loop filter summing node, and generating a phase detector gain element output; and
   a linear gain element, said linear gain element receiving said phase detector gain element output and generating a linear gain element output, wherein said linear gain element output is input to said loop filter summing node in lieu of said phase detector output being input thereto.

14. The timing recovery system of claim 13, wherein said data density detector adjusts said phase detector gain element and said linear gain element to maintain a constant gain and bandwidth with variations in said data density, and said frequency detector adjusts a bandwidth of said phase locked loop to maximize a jitter tolerance.

15. The timing recovery system of claim 5, wherein at least one of said first proportional path and said second proportional path include at least one hold off counter.

16. A receiver system for receiving input data having a phase, said receiver system comprising:
   a receiver circuit;
   an antenna in electronic communication with said receiver circuit; and
   a timing recovery system circuit in electronic communication with said receiver circuit, said timing recovery system circuit comprising:
   a phase locked loop to lock a phase of a local clock to the phase of said input data, said phase locked loop receiving said input data and generating a phase locked loop output, wherein said phase locked loop further includes:
      a phase detector to determine said phase of said input data, said phase detector receiving said input data and generating a phase detector output, and
      a loop filter to provide an additional frequency characteristic to said phase detector output, said loop filter receiving said phase detector output and generating said phase locked loop output;
   a first proportional path with non-linear control to adjust the phase of said input data in response to a data pattern of said input data, said first proportional path receiving said input data and generating a first proportional path output;
   a second proportional path with non-linear control to adjust the phase of said input data in response to an amplitude of data samples derived from said input data, said second proportional path receiving said input data and generating a second proportional path output; and
   a system summing node, wherein said phase locked loop output, said first proportional path output, and said second proportional path output are summed by said system summing node to generate a system summing node output; and a data density detector to monitor a density of said input data, said data density detector receiving said input data and generating a data density detector output; and a frequency detector to determine a frequency of an incoming timing jitter of said input data, said frequency detector receiving said phase detector output and generating a frequency detector output.

17. The receiver system of claim 16, wherein said data pattern of said input data that causes said first proportional path to adjust said phase of said input data is a string of zeros followed by a value of one in said input data.

18. The receiver system of claim 16, wherein said loop filter includes:

an accumulator to indicate a direction in which a phase error is changing, said accumulator receiving said phase detector output and generating an accumulator output; and a loop filter summing node, wherein said phase detector output and said accumulator output are summed by said loop filter summing node, generating said phase locked loop output.

19. The receiver system of claim 16, wherein said timing recovery system circuit further includes:

a third proportional path with non-linear control to reduce an accumulated phase error, said third proportional path receiving said input data and generating a third proportional path output, wherein said third proportional path output is summed by said system summing node.

20. The receiver system of claim 16, wherein said timing recovery system circuit further includes an oscillator, said oscillator receiving said system summing node output and generating a final system output.

21. The receiver system of claim 16, wherein said loop filter further includes:

a phase detector gain element, said phase detector gain element receiving said phase detector output prior to said phase detector output being input to said loop filter summing node, and generating a phase detector gain element output; and a linear gain element, said linear gain element receiving said phase detector gain element output and generating a linear gain element output, wherein said linear gain element output is input to said loop filter summing node in lieu of said phase detector output being input thereto.

22. The receiver system of claim 21, wherein said data density detector adjusts said phase detector gain element and said linear gain element to maintain a constant gain and bandwidth with variations in said data density, and said frequency detector adjusts a bandwidth of said phase locked loop to maximize a jitter tolerance.

23. The receiver system of claim 16, wherein at least one of said first proportional path and said second proportional path include at least one hold off counter.

* * * * *

UNITED STATES PATENT AND TRADEMARK OFFICE
CERTIFICATE OF CORRECTION

PATENT NO. : 7,154,979 B2  Page 1 of 1
APPLICATION NO. : 10/003330
DATED : December 26, 2006
INVENTOR(S) : Hiroshi Takatori, James M. Little and Scott Chiu It is certified that error appears in the above-identified patent and that said Letters Patent is hereby corrected as shown below:

On title page, item 22, Filed
replace "March 11, 2002"
with --October 31, 2001--.

Signed and Sealed this

Tenth Day of April, 2007

JON W. DUDAS
*Director of the United States Patent and Trademark Office*